(12) United States Patent  
Conte et al.

(10) Patent No.: US 8,947,906 B2  
(45) Date of Patent: *Feb. 3, 2015

(54) HIGH-EFFICIENCY DRIVING STAGE FOR PHASE CHANGE NON-VOLATILE MEMORY DEVICES

(71) Applicant: STMicroelectronics S.r.l., Agrate Brianza (IT)

(72) Inventors: Antonio Conte, Tremestieri Etneo (IT); Maria Giaquinta, Catania (IT); Loredana Chiaramonte, Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 128 days.

This patent is subject to a terminal disclaimer.

(21) Appl. No.: 13/771,663

(22) Filed: Feb. 20, 2013

(65) Prior Publication Data

US 2013/0229863 A1    Sep. 5, 2013

(30) Foreign Application Priority Data

Mar. 2, 2012   (IT) .............................. TO2012A0189

(51) Int. Cl.
  *G11C 11/00* (2006.01)
  *G11C 13/00* (2006.01)
  *G11C 5/14* (2006.01)

(52) U.S. Cl.
  CPC ............ *G11C 13/0004* (2013.01); *G11C 5/145* (2013.01); *G11C 5/147* (2013.01); *G11C 13/0038* (2013.01); *G11C 13/0069* (2013.01)
  USPC .......................................... 365/148; 365/163

(58) Field of Classification Search
  USPC .................................................. 365/148, 163
  See application file for complete search history.

(56) References Cited

U.S. PATENT DOCUMENTS

| 7,787,281 | B2* | 8/2010 | Sheu et al. ..................... 365/148 |
| 8,264,872 | B2* | 9/2012 | De Sandre et al. ........... 365/148 |
| 8,767,451 | B2* | 7/2014 | Shin .............................. 365/163 |
| 2006/0002172 | A1 | 1/2006 | Venkataraman et al. | |
| 2009/0122593 | A1 | 5/2009 | Cho et al. | |

FOREIGN PATENT DOCUMENTS

EP    1450373 A1    8/2004

* cited by examiner

*Primary Examiner* — Trong Phan  
(74) *Attorney, Agent, or Firm* — Allen, Dyer, Doppelt, Milbrath & Gilchrist, P.A.

(57) ABSTRACT

A driving stage for a phase change non-volatile memory device may have an output driving unit which supplies an output driving current during an operation of programming of at least one memory cell. A driving-control unit receives an input current and generates at output a first control signal that controls supply of the output driving current by the output driving unit in such a way that a value of this current has a desired relation with the input current. A level-shifter element, set between the output of the driving-control unit and a control input of the output driving unit, determines a level shift of the voltage of the first control signal so as to supply to the control input of the output driving unit a second control signal, having a voltage value that is increased with respect to, and is a function of, the first control signal.

25 Claims, 6 Drawing Sheets

HIGH-EFFICIENCY DRIVING STAGE FOR PHASE CHANGE NON-VOLATILE MEMORY DEVICES

FIELD OF THE INVENTION

The present invention relates to a driving stage for phase change non-volatile memory devices, designed for the supply of driving currents during programming operations of the memory cells.

BACKGROUND OF THE INVENTION

As it is known, phase change non-volatile memories, so-called ePCMs (embedded Phase Change Memories), represent a new generation of integrated memories, in which, to store information, the characteristics of materials having the property of switching between phases having different electrical characteristics are exploited. For example, these materials can switch between an amorphous, disorderly, phase and a crystalline or polycrystalline, orderly, phase, and the two phases are associated to resistivities of considerably different value, and consequently to a different value of a datum stored. For example, the elements of the VI group of the periodic table, such as tellurium (Te), selenium (Se), or antimony (Sb), referred to as chalcogenides or chalcogenic materials, may advantageously be used for producing phase change memory cells; in particular, an alloy made up of germanium (Ge), antimony (Sb), and tellurium (Te), known as GST (having the chemical composition $Ge_2Sb_2Te_5$) is currently widely used in such memory cells.

Phase changes may be obtained by locally increasing the temperature of the cells of chalcogenic material, through resistive electrodes (generally known as heaters) set in contact with respective regions of chalcogenic material.

Selection devices (for example, MOSFETs), are connected to the heaters and enable passage of a programming electric current through a respective heater; this electric current, by the Joule effect, generates the temperatures necessary for the phase change. In particular, when the chalcogenic material is in the amorphous state, at a high resistivity (the so-called RESET state), it is required to apply a current/voltage pulse (or an appropriate number of current/voltage pulses) of duration and amplitude such as to enable the chalcogenic material to cool slowly. Subjected to this treatment, the chalcogenic material changes its state and switches from the high-resistivity state to a low-resistivity state (the so-called SET state). Vice versa, when the chalcogenic material is in the SET state, it is required to apply a current/voltage pulse having appropriate duration and high amplitude so as to cause the chalcogenic material to return into the high-resistivity amorphous state.

During reading, the state of the chalcogenic material is detected by applying a voltage sufficiently low as not to cause a sensible heating thereof, and then by reading the value of the current flowing in the memory cell. Given that the current is proportional to the conductivity of the chalcogenic material, it is possible to determine in which state the material is, and consequently determine the datum stored in the memory cell.

In general, PCMB afford important advantages, among which are high scalability and reading speed combined with a reduced current consumption and a high efficiency.

In a known way, and as shown schematically in FIG. 1 (limited to just the parts required for an understanding of the present embodiments), a non-volatile PCM device 1 includes a memory array 2 made of a plurality of memory cells 3, arranged in rows (wordlines, WL) and columns (bitlines, BL).

Each memory cell 3 includes a phase change storage element 3a and selector element 3b, which are connected in series between a respective bitline BL and a terminal at a reference potential (for example, ground, GND). In particular, a wordline WL is defined by the set of all the control terminals of the selector transistors aligned along one and the same row.

The storage element 3a includes a phase change material (for example, a chalcogenide, such as GST), and is consequently able to store data in the form of resistance levels associated to the different phases assumed by the phase change material. The selector element 3b, as in the embodiment illustrated, may be an NMOS transistor having its gate terminal connected to the wordline WL, its drain terminal connected to the storage element 3a, and its source terminal connected to the terminal at reference potential (in particular ground, GND). The selector element 3b is controlled so as to enable, when selected, the passage of a reading/programming driving current through the phase change storage element 3a, during respective reading/programming operations.

A column decoder 4 and a row decoder 5 enable selection, based on address signals received at the input and more or less complex decoding schemes, of the memory cells 3, and in particular of the corresponding wordlines WL and bitlines BL, each time addressed, enabling biasing thereof at appropriate voltage and current values by corresponding driving stages. In particular, shown in FIG. 1 is the driving stage 6 designed to supply the driving currents for the bitlines BL of the memory array 2 during the operations of programming of the SET or RESET states in the memory cells 3.

In particular, it is known that these programming operations, both when programming of the SET state and when programming of the RESET state of the chalcogenide material of the memory cells 3 is required, require supplying to the storage elements 3a of high value current pulses, for the activation of the mechanisms of a change of state. Moreover, an accurate control of the parameters of the programming current pulses may be important for ensuring efficient and repeatable transitions between the SET and RESET states, and this control has to be ensured in a wide range of values of current so as to deal with the various operating conditions of the memory device 1. For example, a low distortion of the waveform of the current pulses may be in a wide range between 100 µA and 1000 µA (with a maximum voltage generated on the bitlines BL by the column decoder 4 that may reach a value of approximately 3 V).

Once again by way of example, FIGS. 2a and 2b show plots of possible RESET pulses and SET pulses. FIG. 2a shows a reset pulse between 500 to 700 µA, having a duration of 200 ns. FIG. 2b shows a set pulse between 200 to 300 µA, having a deviation of 2000 ns. It is evident that meeting of the above mentioned stringent conditions in the control of the parameters of the waveforms of the programming current pulses may be an important aspect to be addressed in the design of memory devices and that may represent one of the major important aspects thereof.

FIG. 3 is a schematic illustration of a driving stage 6, of a known type, for supplying from a charge pump having a voltage $V_{cp}$, during the programming operations, output driving currents, here designated by $I_{<k>}$ (where k is an index of integer value, for example ranging between 0 and 31, in the case where the driving stage 6 is connected to thirty-two bitlines BL), designed for driving the memory cells 3. The output driving currents $I_k$ are supplied to the column decoder 4, and are then to be provided, according to the decoding schemes implemented, to the bitlines BL of the memory array 2.

In detail, the driving stage 6 includes a driving-control unit 7, having a low-impedance input receiving an input current $I_{in}$ of a low value (i.e., sensibly lower than the value required for the output driving currents $I_k$), for example, equal to 200 μA in the case where the value required for the output driving current $I_k$ is 800 μA, generated by an input stage 8 as a function of the specific required memory operation (for example, having a different value for the SET and RESET programming operations). The input-current-generator stage 8 may be implemented in a wide range of ways, generally depending on the type of application. For example, a digital-to-analog converter (DAC) can be used, whereby a given output current corresponds to a given configuration of a certain number of input bits.

The driving stage 6 further comprises an output driving unit 9, connected to the driving-control unit 7 and designed to generate and distribute to the bitlines BL the output driving currents $I_k$. The driving-control unit 7 and the output driving unit 9 are moreover supplied by a charge-pump stage 10, which supplies suitable supply electrical quantities, in particular a boosted voltage $V_{cp}$ in the high-voltage (HV) range (for example, in the range between 4 V and 5 V), of a value higher than the low logic voltages used in the memory device 1 (which have, for example, a value in the range between 1.08 V and 1.32 V).

The driving-control unit 7 includes a plurality of control sub-units 11, and the output driving unit 9 comprises a respective plurality of driving sub-units 12, each of which, appropriately supplied by the charge-pump stage 10, is designed to supply a respective output driving current $I_k$, having a value amplified by a factor β with respect to the input current $I_{in}$, according to the relation: $I_k = I_{in} \cdot \beta$. The voltages supplied at output by the driving sub-units 12 are, for example, in the region of 3 V.

In particular, each control sub-unit 11 drives in an appropriate way a respective set of driving sub-units 12, supplying appropriate control signals for enabling supply at output of the respective output driving currents $I_k$. For example, each control sub-unit 11 may drive four respective driving sub-units 12 (so that in the driving stage eight control sub-units 11 may, for example, be present for supplying thirty-two output driving currents $I_k$ via a corresponding number of driving sub-units 12).

As illustrated in FIG. 4 (which refers, for simplicity of illustration, to a single control sub-unit 11 and to the corresponding set of driving sub-units 12, in the example four in number), each control sub-unit 11 forms, with the corresponding set of driving sub-units 12, a current mirror in a cascode configuration, designed to mirror on the various outputs the input current $I_{in}$ with amplification factor β. The control sub-unit 11 defines the input branch of the current mirror, while the driving sub-units 12 define respective output branches of the same mirror, connected to one another in parallel.

In greater detail, the control sub-unit 11 includes a cascode control transistor $MC_c$ and an input mirror transistor $MP_c$, both of a PMOS type and connected in series between a first input $In_1$ of the driving stage 6, which receives the input current $I_{in}$, and a second input $In_2$ of the driving stage 6, connected to the output of the charge-pump stage 10 and receiving the boosted voltage $V_{cp}$. The control terminal of the cascode control transistor $MC_c$ is connected to a third input $In_3$, which receives a cascode biasing voltage $V_{cascp}$, of an appropriate value, while the control terminal of the input mirror transistor $MP_c$ is connected to the first input $In_1$ and to the respective conduction terminal of the cascade control transistor $MC_C$, so as to provide the diode configuration for the current-mirroring operation.

Each driving sub-unit 12 (for convenience an n-th driving sub-unit 12 is described, but altogether similar considerations apply to the other sub-units of the corresponding set, designated by n+1, n+2 and n+3, where n is an integer index representing the set) comprises a respective cascode driving transistor $MC_n$ and an output mirror transistor $MP_n$, both of a PMOS type and connected in series between the second input $In_2$ and a respective output of the driving stage 6, supplying the respective output driving current, here designated by $I_{<n>}$. The control terminals of the cascode driving transistor $MC_n$ and of the output mirror transistor $MP_n$ are connected to the control terminals of the cascode control transistor $MC_c$ and of the input mirror transistor $MP_c$, respectively.

The circuit configuration described enables mirroring of the input current $I_{in}$ with the desired amplification factor β, given by the different sizing ratios (width/length, W/L) of the transistors in the input and output branches. In particular, the cascode configuration advantageously enables a drain-to-source voltage drop Vds to be obtained on the output mirror transistors $MP_n$ that is substantially constant, so as to ensure a good repeatability of the electrical performance.

However, the configuration described also has some limitations that do not enable full exploitation of the advantages thereof.

In particular, for reason of speed and consumption, each control sub-unit 11 may drive a limited number (three or, as in the case illustrated, four) of driving sub-units 12 connected in parallel, so that a considerable occupation of area is required for the integrated implementation of the sole driving-control unit 7. Moreover, it may be required that all the transistors in the circuit are of the high-voltage type to withstand the high voltage values present across their terminals, which, combined with the high requirements of output current, entails the use of transistors of large dimensions (with large thicknesses of the corresponding oxides), and high costs, and once again a considerable occupation of space. Given that the entire driving stage 6 is supplied by the charge-pump stage 10, the latter must be sized so as to meet the high current requirements thereof, and in particular the inefficiency of the driving stage 6 results in a high consumption of current required of the charge-pump stage 10.

SUMMARY OF THE INVENTION

An object of the embodiments of the present invention is consequently to address the problems highlighted above, in particular with respect to the high current consumption and occupation of area of prior approaches.

According to the present invention, a driving stage for a phase change non-volatile memory device, and a corresponding calibration method are provided.

A driving stage for a phase change non-volatile memory device may have an output driving unit which supplies an output driving current during an operation of programming of at least one memory cell. A driving-control unit receives an input current and generates at output a first control signal that controls supply of the output driving current by the output driving unit in such a way that a value of this current has a desired relation with the input current. A level-shifter element, set between the output of the driving-control unit and a control input of the output driving unit, determines a level shift of the voltage of the first control signal so as to supply to the control input of the output driving unit a second control signal, having a voltage value that is increased with respect to, and is a function of, the first control signal.

BRIEF DESCRIPTION OF THE DRAWINGS

For a better understanding of the present invention, preferred embodiments thereof are now described, purely by way of non-limiting example, with reference to the attached drawings.

DETAILED DESCRIPTION OF THE PREFERRED EMBODIMENTS

Figure 1:
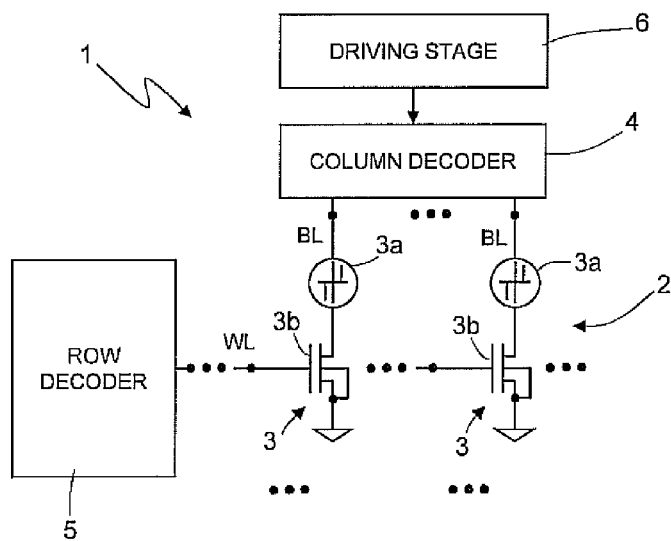
FIG. 1 is a schematic block diagram illustrating a known non-volatile PCM device, according the prior art.
Figure 2A:
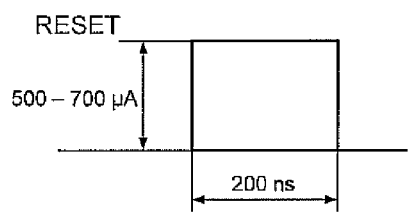
FIGS. 2a and 2b are graphs illustrating programming-current pulses in different operating conditions of the memory device of FIG. 1.
Figure 2B:
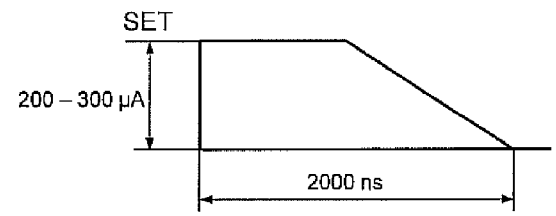
Figure 5:
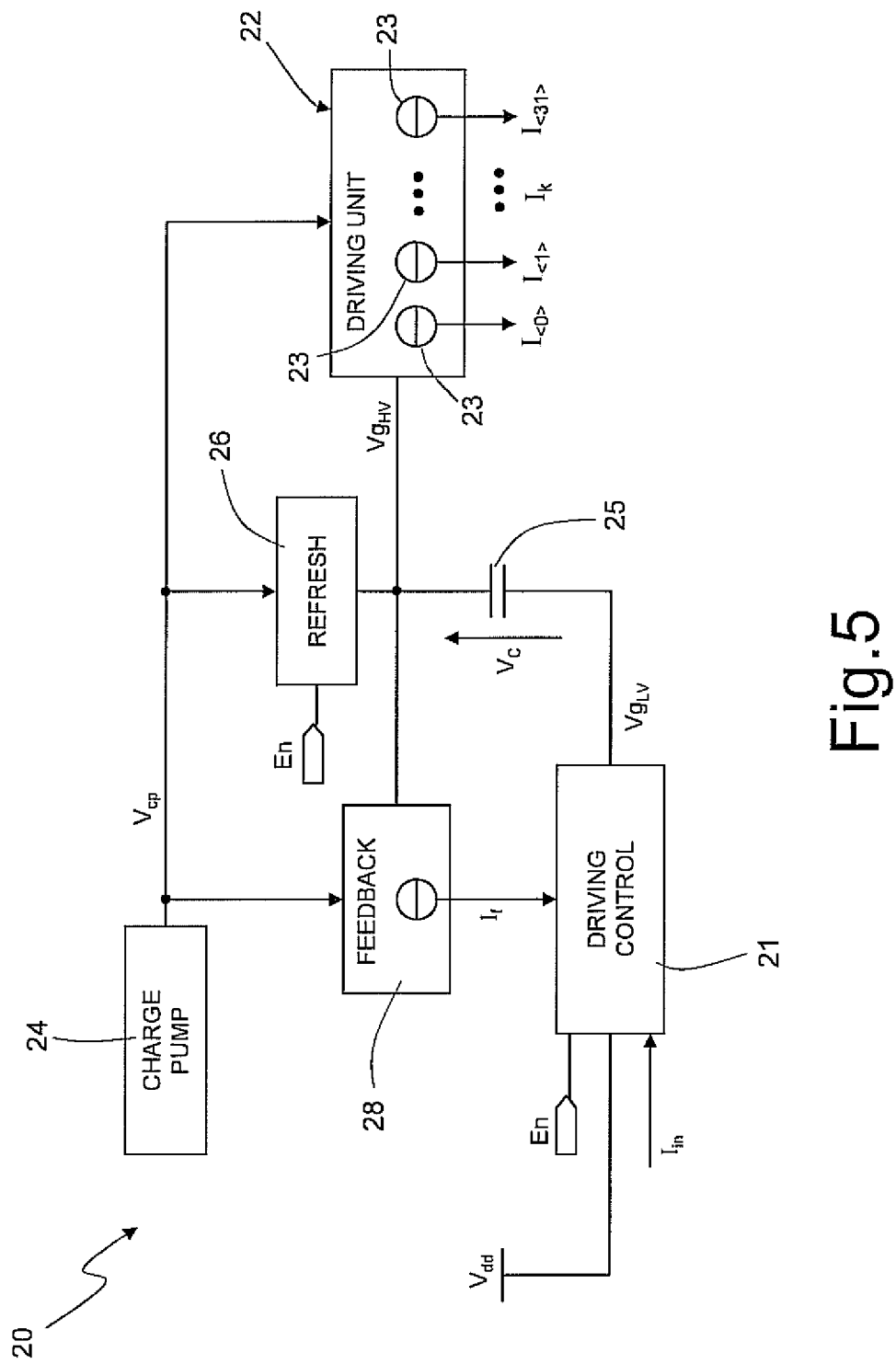
FIG. 5 is a schematic block diagram illustrating a driving stage for a phase change non-volatile memory device, according to an embodiment of the present invention.

As shown in FIG. 5, according to one embodiment of the invention, a driving stage 20 for a phase change non-volatile memory device (for example, of the type described with reference to FIG. 1, which for this reason is not described again) includes a driving-control unit 21, which receives, on a first low-impedance input, an input current $I_{in}$, with an appropriate value that is a function of a specific memory operation, and an output driving unit 22 including a plurality of driving sub-units 23 (and represented schematically as controlled current generators), each of which, is appropriately supplied by a charge-pump stage 24, and supplies on a respective output a respective output driving current $I_k$, having a value amplified by a factor β with respect to the input current $I_{in}$, according to the relation: $I_k = I_{in} \cdot β$.

As will be described in detail hereinafter, in addition to receiving a boosted voltage $V_{cp}$ from the charge-pump stage 24, the output driving unit 22 receives at input a high-voltage control signal $Vg_{HV}$, in particular designed to drive the control terminals of respective output transistors connected to one another in parallel and, each, to a respective output of the output driving unit 22.

Figure 3:
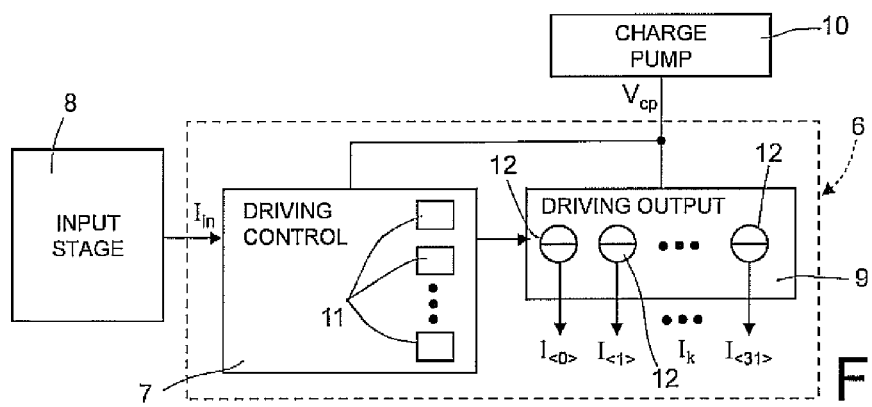
FIG. 3 is an overall block diagram of a known driving stage of the device of FIG. 1.
Figure 4:
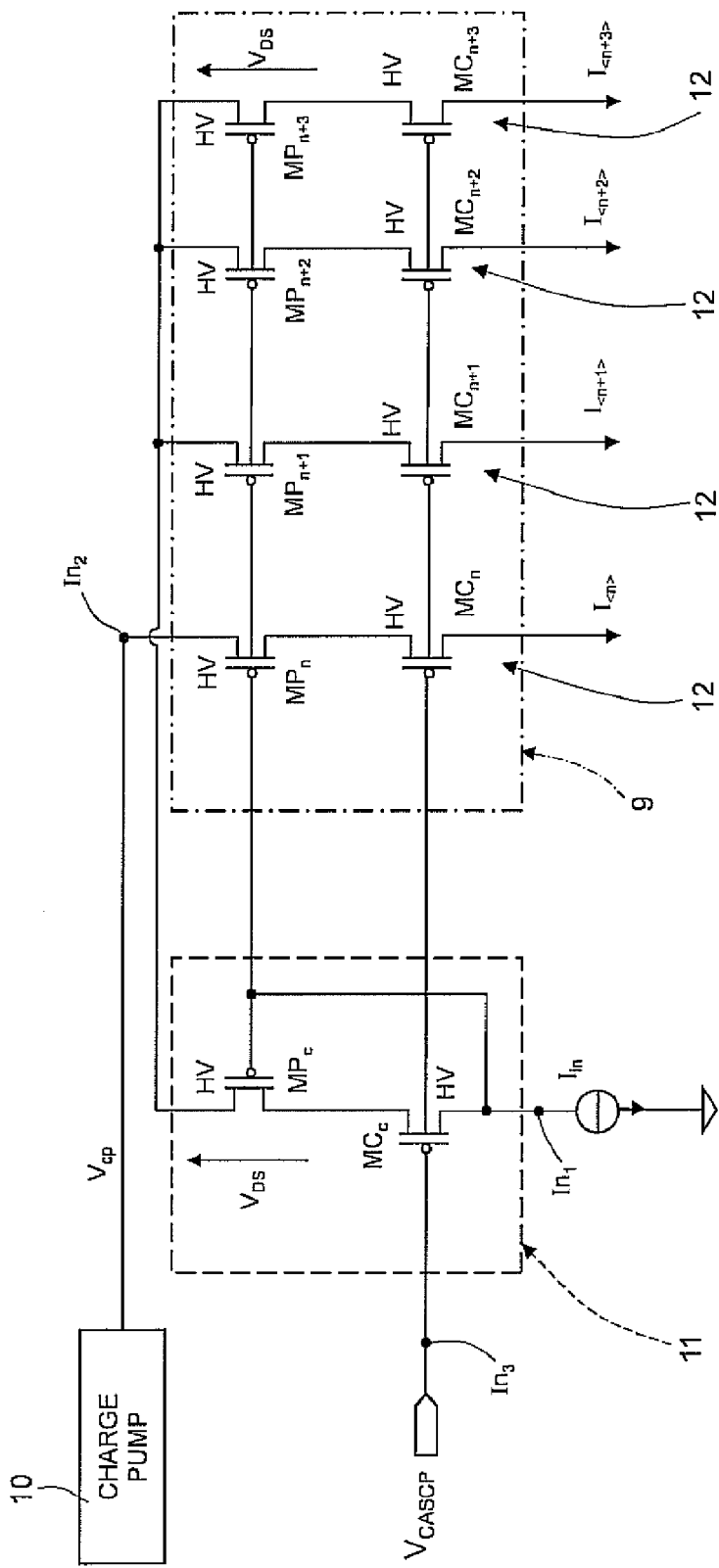
FIG. 4 is a schematic diagram illustrating in greater detail the circuit implementation of a portion of the driving stage of FIG. 3.

According to one aspect of the present embodiment, the driving-control unit 21, instead of being supplied, as in known approaches (for example, as described with reference to FIG. 3), by the charge-pump stage 24, has a supply-voltage input connected to a low-voltage supply source of the memory device 1, which supplies a logic supply voltage $V_{DD}$, for example, of a value between 1.08 V and 1.32 V.

Moreover, instead of driving directly the output driving unit 22 (once again as in known approaches), the driving-control unit 21 supplies at output a low-voltage control signal $Vg_{LV}$, which is supplied to a first pin of a level-shifter capacitor 25, of a high-voltage type. A second pin of the same level-shifter capacitor 25 provides the high-voltage control signal $Vg_{HV}$ for the output driving unit 22, with a value equal to the sum of the voltage of the low-voltage control signal $Vg_{LV}$ and of the voltage stored on the level-shifter capacitor 25.

In other words, the driving-control unit 21 supplies at output a control signal in the low-voltage range, which, only after appropriate level shifting performed by the level-shifter capacitor 25 (by addition of a DC component), drives in an appropriate way the driving sub-units 23 connected in parallel to one another at the output. In particular, on the level-shifter capacitor 25 a shift voltage $V_c$ is accumulated in use, having an appropriate value and such that, once added to the low-voltage control signal $Vg_{LV}$, will enable generation, through the driving sub-units 23 driven by the resulting high-voltage control signal $Vg_{HV}$, of the desired values for the output driving currents $I_k$.

The driving stage 20 further comprises a refresh unit 26, having an output connected to the second pin of the level-shifter capacitor 25 and a supply-voltage input receiving the boosted voltage $V_{cp}$ from the charge-pump stage 24. As will be described in detail hereinafter, the refresh unit 26 moreover receives at input an enable signal En, for example of an impulsive type, and is configured to activate, according to the value of the enable signal En, refresh to an appropriate value of the shift voltage $V_c$ on the level-shifter capacitor 25, so as to compensate voltage drops across it following upon the programming operations and restore a desired value thereof. As described in detail hereinafter, the same enable signal En is moreover supplied at input to the driving-control unit 21.

The driving stage 20 further comprises a feedback unit 28, having a first input connected to the second pin of the level-shifter capacitor 25 and a second input receiving the boosted voltage $V_{cp}$ from the charge-pump stage 24. The feedback unit 28 supplies at output a feedback signal $I_F$, for example, a feedback current, to the driving-control unit 21, on the basis of which the driving-control unit 21 is able to control that the output driving current $I_k$ reaches the desired value (implementing a feedback control closed loop).

In particular, according to one aspect of the present embodiments, the value of the feedback current $I_F$ represents only a small fraction of the output driving current $I_k$, for example satisfying the relation: $I_F = I_k/10$.

A possible circuit embodiment of the driving stage 20 is now described in greater detail, except as regards the driving-control unit 21, which will be described separately hereinafter, emphasizing in general the fact that for the implementation of the units and sub-units discussed previously low-voltage transistors may be used (unlike what may be required in known circuit approaches, for example of the type described previously with reference to FIG. 3).

Figure 6:
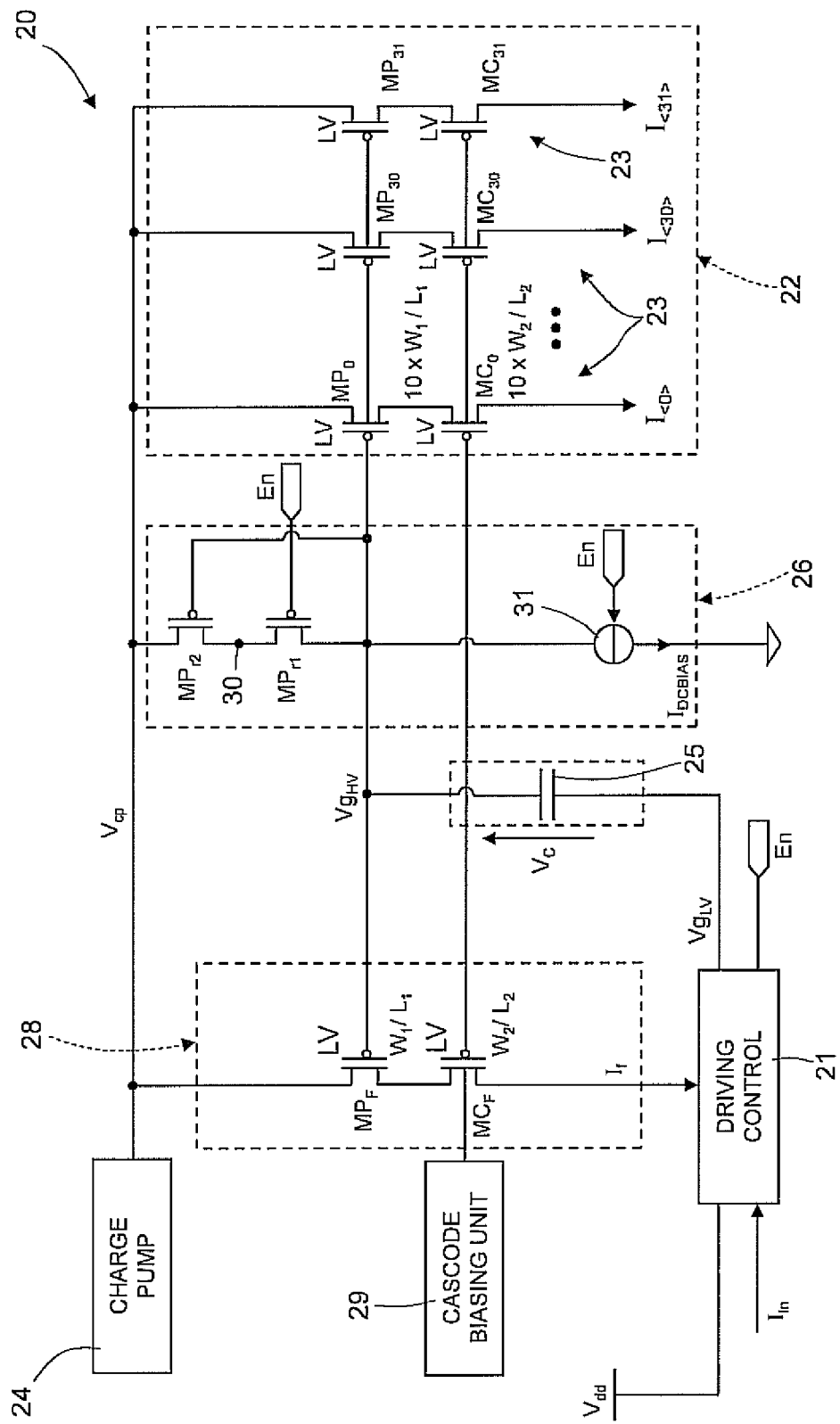
FIG. 6 is a schematic diagram illustrating in greater detail an example of a circuit implementation of parts of the driving stage of FIG. 5.

As illustrated in FIG. 6, the output driving unit 22 comprises a plurality of driving sub-units 23, numbering thirty-two in the example illustrated (and in any case corresponding to the total number of outputs of the driving stage 20 towards the column decoder, here not illustrated), which are connected in series between the output of the charge-pump stage 24 and a respective output of the driving stage 20. Each driving sub-unit 23 comprises a respective cascode driving transistor MCk (with k in this case ranging from 0 to 31) and an output transistor MPk, both of a low-voltage PMOS type, connected in series and to a respective output of the driving stage 20 which supplies the respective output driving current $I_k$.

The control terminal of each cascode driving transistor MCk is connected to the output of a cascade biasing unit 29 (of a known type, here not described in detail, for example including a PMOS diode biased with a constant current of an appropriate value), which supplies an appropriate cascode biasing voltage $V_{cascp}$, with a value such as to obtain a drain-to-source voltage $V_{DS}$ on the output transistors MPk that will enable operation in the saturation region. The control terminal of each output transistor MPk is, instead, connected to the second pin of the level-shifter capacitor 25, and accordingly receives the high-voltage control signal $Vg_{HV}$.

The refresh unit 26 includes a first refresh transistor $MPr_1$, of a PMOS type, connected between the second pin of the level-shifter capacitor 25 and an internal node 30, and having its control terminal receiving the enable signal En. A second refresh transistor $MPr_2$, which is also of a PMOS type, is connected between the internal node 30 and the output of the charge-pump stage 24, and has its control terminal connected to the aforesaid second pin of the level-shifter capacitor 25.

The refresh unit 26 further comprises a biasing-current generator 31 controlled and selectively enabled by the enable signal En, and connected between a node at reference potential (for example, ground) and the second pin of the level-shifter capacitor 25. When enabled, the biasing-current generator 31 supplies a DC biasing current $I_{DCBIAS}$ of an appropriate value (which is a function also of the dynamics that it is desired to obtain for the output current, for example, between 100 µA and 1000 µA).

In use, an appropriate logic value of the enable signal En (indicating the presence of a refresh operating mode), in the example a low logic value, causes the first and second refresh transistors $MPr_1$, $MPr_2$ to assume a diode configuration, substantially selectively creating a conductive path between the output of the charge-pump stage 24 and the second pin of the level-shifter capacitor 25. This logic value of the enable signal En moreover entails activation of the biasing-current generator 31.

In the refresh operating mode, the value of the shift voltage $V_c$ across the level-shifter capacitor 25 is appropriately updated to a desired value, substantially defined by the value of the boosted voltage $V_{cp}$, reduced by the voltage drop across the diode provided by the first and second refresh transistors $MPr_1$, $MPr_2$ (this value being a function of the refresh quantity $I_{DCbias}$) and by the voltage present on the first pin of the level-shifter capacitor 25, determined, as described in detail hereinafter, by the driving-control unit 21 (operating in turn as a function of the value of the enable signal En). During the refresh operating mode, the DC biasing current $I_{DCBIAS}$ may moreover have a value such that the output transistors MPk will supply the minimum current of the dynamics envisaged, for example 100 µA, in such a way that the consumption during the refresh mode is reduced.

Instead, when the enable signal En has a different logic value (thus determining a normal operating mode, different from the refresh mode, in which the desired driving currents for operation of the memory cells are supplied at output), the voltage value on the second pin of the level-shifter capacitor 25, corresponding to the value of the high-voltage control signal $Vg_{HV}$, is fixed by the value of the low-voltage control signal $Vg_{LV}$ and by the shift voltage $V_c$ across the level-shifter capacitor 25. The biasing-current generator 31 is de-activated by the enable signal En, while the first refresh transistor $MPr_1$ is turned off by the enable signal En, thus disconnecting the second pin of the level-shifter capacitor 25 from the output of the charge-pump stage 24.

The feedback unit 28 defines a substantially specular circuit branch mirrored as compared to each of the driving sub-units 23, comprising a cascode feedback transistor MCf and a feedback transistor MPf, both of a low-voltage PMOS type and connected in series between the output of the charge-pump stage 24 and the feedback input of the driving-control unit 21. The control terminal of the cascode feedback transistor MCf moreover receives the cascode biasing voltage $V_{cascp}$ from the cascode biasing unit 29 (in a way similar to each of the cascode biasing transistors MCk), and the control terminal of the feedback transistor MPf receives the high-voltage control signal $Vg_{HV}$, being connected to the second pin of the level-shifter capacitor 25 (in a way similar to each of the output transistors MPk).

In particular, the feedback transistor MPf has a first sizing ratio (width-to-length ratio) $W_1/L_1$ that is a fraction of the corresponding sizing ratio of each of the output transistors MPk (having, for example, a ratio that is ten times greater, $10 \cdot W_1/L_1$). Likewise, the cascode feedback transistor MCf has a second sizing ratio $W_2/L_2$ that is equal to the same fraction of the corresponding sizing ratio of each of the output cascode transistors MCk (for example, having a ratio ten times greater, $10 \cdot W_2/L_2$).

In use, given the aforesaid circuit configuration and the aforesaid sizing of the components of the feedback unit 28, the feedback current $I_F$ supplied to the feedback input of the driving-control unit 21 is automatically reduced, with respect to the output driving current $I_k$, by the same factor that links the sizing ratios of the aforesaid transistors, in the example a factor of ten, so that the relation $I_k = 10 \cdot I_F$ is satisfied.

Figure 7:
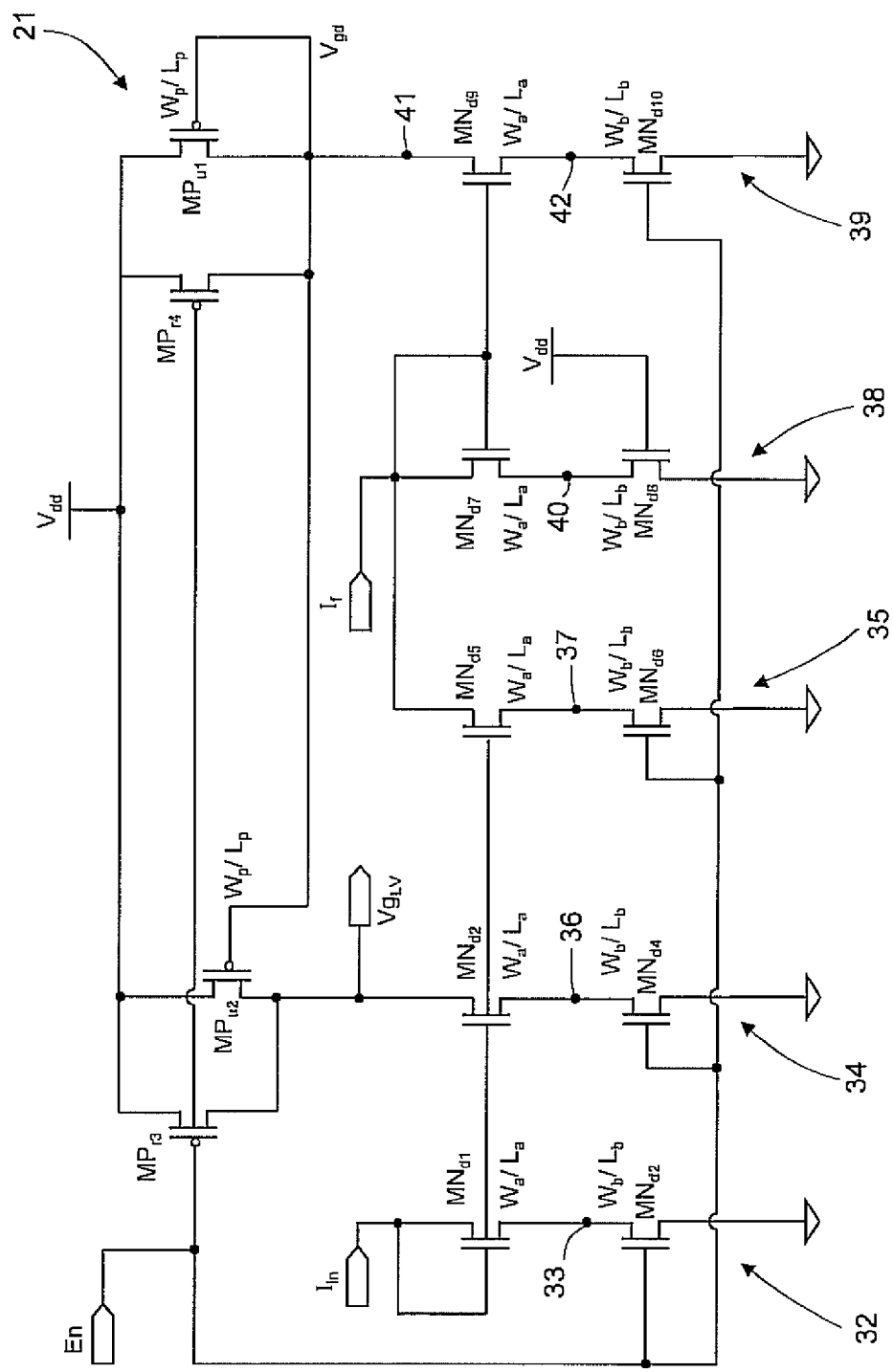
FIG. 7 is a circuit diagram of a driving-control unit of the driving stage of FIGS. 5 and 6.

The circuit configuration of the driving-control unit 21 is now described, with reference to FIG. 7. In general, the driving-control unit 21 constitutes, using low-voltage transistors, a transresistance current differential amplifier, receiving at input the input current $I_{in}$ and the feedback current $I_F$, and operating in such a way as to supply at output (in particular, at a high-impedance output) a value of the low-voltage control signal $Vg_{LV}$ such that, in the condition of equilibrium, a desired relation between the values of the input current $I_{in}$ and feedback current $I_F$ applies (for example, to reduce as much as possible a difference, or unbalancing, between these values).

In particular, in the embodiment illustrated, the circuit configuration is such that the relation $I_F = 2 \cdot I_{in}$ applies; consequently, the input current $I_{in}$ and output current $I_k$ are linked by the relation $$I_k = 2 \cdot \beta \cdot I_{in}$$

where, as previously highlighted, the factor β is, for example, equal to 10.

In greater detail, the driving-control unit 21 comprises an input branch 32, formed by a first NMOS transistor $MNd_1$, diode-connected between the input of the driving-control unit 21 that receives the input current $I_{in}$ and a node 33, and a second NMOS transistor $MNd_2$, connected in series to the first NMOS transistor $MNd_1$, between the node 33 and the node at reference potential of the circuit, and having its control terminal receiving the enable signal En.

The driving-control unit 21 further comprises a first mirrored branch 34 and a second mirrored branch 35. The first mirrored branch 34 is formed by a third NMOS transistor $MNd_3$, connected between the output of the driving-control unit 21 that supplies the low-voltage control signal $Vg_{LV}$ and a node 36, and having its control terminal connected to the control terminal of the first NMOS transistor $MNd_1$. A fourth NMOS transistor $MNd_4$, is connected in series to the third NMOS transistor $MNd_3$, between the node 36 and the node at reference potential of the circuit, and has its control terminal receiving the enable signal En.

The second mirrored branch 35 is formed by a fifth NMOS transistor $MNd_5$, connected between the feedback input of the driving-control unit 21 that receives the feedback current $I_F$ and a node 37, and having its control terminal connected to the control terminal of the first NMOS transistor $MNd_1$. A sixth NMOS transistor $MNd_6$, is connected in series to the fifth NMOS transistor $MNd_5$, between the node 37 and the node at reference potential of the circuit, and has its control terminal receiving the enable signal En.

The driving-control unit 21 further comprises a feedback input branch 38 and a feedback mirrored branch 39. The feedback input branch 38 is formed by a seventh NMOS transistor $MNd_7$ diode-connected between the feedback input of the driving-control unit 21 that receives the feedback current $I_F$ and a node 40. An eighth NMOS transistor $MNd_8$ is connected in series to the seventh NMOS transistor $MNd_7$, between the node 40 and the node at reference potential of the circuit, and has its control terminal connected to the voltage supply source supplying the logic supply voltage Vdd.

The feedback mirrored branch 39 in turn includes a ninth NMOS transistor $MNd_9$, connected between a node 41 and a node 42, and having its control terminal connected to the control terminal of the seventh NMOS transistor $MNd_7$. A tenth NMOS transistor $MNd_{10}$ is connected in series to the ninth NMOS transistor $MNd_9$, between the node 42 and the node at reference potential of the circuit, and has its control terminal receiving the enable signal En.

In particular, the first, third, fifth, seventh, and ninth NMOS transistors $MNd_1$, $MNd_3$, $MNd_5$, $MNd_7$, $MNd_9$ have one and the same sizing ratio $W_a/L_a$, as likewise the second, fourth, sixth, eighth, and tenth NMOS transistors $MNd_2$, $MNd_4$, $MNd_6$, $MNd_8$, $MNd_{10}$ have a respective same sizing ratio $W_b/L_b$.

The driving-control unit 21 further comprises a first output transistor $MPu_1$ and a second output transistor $MPu_2$, of a PMOS type, and a third refresh transistor $MPr_3$ and a fourth refresh transistor $MPr_4$, which are also of a PMOS type.

The first output transistor $MPu_1$ is diode-connected between the voltage supply source that supplies the logic supply voltage Vdd and the node 41. The second output transistor $MPu_2$ is connected between the voltage supply source that supplies the logic supply voltage Vdd and the output on which the low-voltage control signal $Vg_{LV}$ is present and has its control terminal connected to the control terminal of the first output transistor $MPu_1$. The first and second output transistors $MPu_1$, $MPu_2$ have one and the same sizing ratio $W_p/L_p$.

The third refresh transistor $MPr_3$ is connected between the voltage supply source that supplies the logic supply voltage Vdd and the output on which the low-voltage control signal $Vg_{LV}$ is present and has its control terminal receiving the enable signal En. The fourth refresh transistor $MPr_4$ is connected between the voltage supply source that supplies the logic supply voltage Vdd and the node 41, and also has its control terminal receiving the enable signal En.

In use, and in a way that will be evident from an examination of the circuit, during the normal operating mode (with the enable signal En having a high logic value), a current of a value substantially equal to the input current $I_{in}$ circulates in the various circuit branches, these being made of transistors with the same characteristics and biased in the same operating conditions. Consequently, the feedback current $I_F$ is twice the value of the input current $I_{in}$, given that both the second mirrored branch 35 and the feedback input branch 38 are connected to the feedback input. In addition, in the equilibrium condition, once again given the substantial circuit symmetry, the value of the low-voltage control signal $Vg_{LV}$ is substantially equal to the voltage value on the control terminal of the first output transistor $MPu_1$, which is diode-connected (here designated by $V_{gd}$). It should be noted that, on account of the feedback action, the value of the low-voltage control signal $Vg_{LV}$ varies in an appropriate way between 0 V and the value of the logic supply voltage Vdd to bring back the circuit into the equilibrium condition.

In any case, the value of the low-voltage control signal $Vg_{LV}$, after the appropriate level shifting by the level-shifter capacitor 25, drives the control terminals of the output driving transistors, to obtain, in a situation of equilibrium, the desired value for the output driving current $I_k$ (for example, in the case illustrated, $I_k=2\cdot\beta\cdot I_{in}$).

During the refresh mode, instead, the low value of the enable signal En turns off the second, fourth, sixth, eighth, and tenth NMOS transistors $MNd_2$, $MNd_4$, $MNd_6$, $MNd_8$, $MNd_{10}$ and turns on the third and fourth refresh transistors $MPr_3$, $MPr_4$, so that the low-voltage control signal $Vg_{LV}$ goes substantially to the value of the logic supply voltage Vdd. In this operating mode, as previously highlighted, the refresh of the shift voltage $V_c$ on the level-shifter capacitor 25 occurs, in the presence of a pre-set and controlled value of the low-voltage control signal $Vg_{LV}$ (basically corresponding to the value Vdd).

In a way not illustrated in the previous figures, the enable signal En may be generated and supplied to the driving-control unit 21 by a management unit of the memory device, which supervises its general operation, also determining timing of the reading and programming operations. For example, advantageously, the refresh mode of the shift voltage $V_c$ on the level-shifter capacitor 25 may be activated following upon each (SET or RESET) programming pulse that is applied to the memory cells via the driving stage 20.

Figure 8:
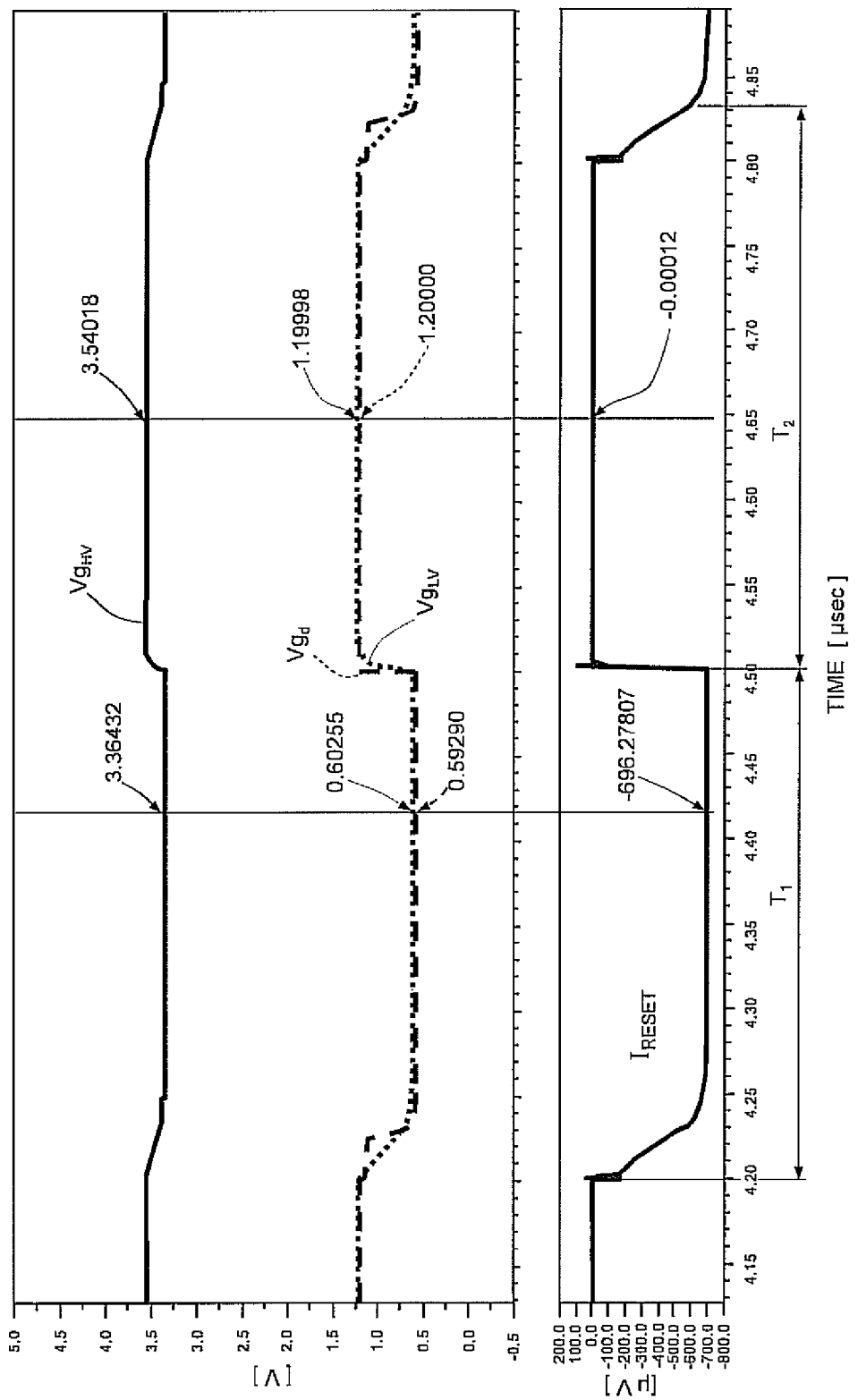
FIG. 8 is a timing diagram of electrical quantities in the driving stage of FIG. 5.

In this regard, FIG. 8 shows an example of application, in the time interval $T_1$, of a programming pulse, in particular a RESET current pulse (designated by $I_{Reset}$), having an amplitude of approximately 700 μA, followed, in a consecutive time interval $T_2$, by the operation of refresh of the value of the shift voltage $V_c$ on the level-shifter capacitor 25. In the example, following upon the refresh operation, the value of the high-voltage control signal $Vg_{HV}$ goes, for example, from a value of approximately 3.36 V to a value of approximately 3.54 V, as a result of refresh of the value of the shift voltage $V_c$. The substantial equality may also be noted of the values of the low-voltage control signal $Vg_{LV}$ and of the voltage $Vg_d$ of the control terminal of the first output transistor $MPu_1$, which is diode-connected.

The advantages of the biasing stage according to the present embodiments should be clear from the foregoing description.

In any case, it is emphasized that the approach described affords an evident saving in the occupation of area required for the driving-control unit 21, which in fact has a unitary and particularly compact structure for all the driving sub-units 23 at the output. In particular, the use of low-voltage components (except for the sole level-shifter capacitor 25) enables a considerable saving of area in the integrated implementation.

The approach described has a high efficiency in the current consumption, in so far as driving of the control terminals of the output transistors of the driving sub-units 23 is performed via the level-shifter capacitor 25 so that no current is required by the charge-pump stage 24. In addition, the feedback current $I_F$, which is required by the charge-pump stage 24, has a low value, corresponding just to a small fraction (for example, one tenth, but it could be further reduced without altering operation of the circuit) of the output driving current $I_k$, which enables a considerable saving in terms of consumption. In addition, the driving-control unit 21 is advantageously supplied by the logic supply voltage Vdd, having a particularly reduced value, instead of being supplied by the charge-pump stage 24.

The present embodiments provide the possibility of obtaining a saving in the occupation of area of even up to five times as compared to traditional approaches, with an efficiency (evaluated as the ratio between the current supplied by the voltage-supply stage and the current supplied at output) lower than 1.2. In an evident way, the aforesaid savings in the consumption of area and current afford an associated saving in the manufacturing costs and in the costs associated to the use of the memory device.

Finally, it is clear that modifications and variations may be made to what is described and illustrated herein, without thereby departing from the scope of the present invention, as defined in the annexed claims.

In particular, it is evident that the phase change non-volatile memory device incorporating the biasing stage described may have a wide range of uses, among which, for example, in microcontrollers, in applications with high safety requirements using smart cards with contact interface (such as PAYTV systems, SIMs, TPM modules) that has to satisfy the ETSI consumption specifications, and in contactless smart-card applications (RFIDs, NFCs, bank credit cards, etc.), where the memory module has a current budget limited by the system of energy harvesting (recovery of energy from the carrier) for all the operations (both writing operations and reading operations).

That which is claimed:

1. A driving stage for a phase change non-volatile memory device, the driving stage comprising:
   an output driving unit configured to supply an output driving current during an operation of programming of at least one memory cell of the phase change non-volatile memory device;
   a driving-control unit configured to receive an input current and to generate on a control output a first control signal configured to control supply of the output driving current by said output driving unit in such a way that a value of the output driving current is based upon the input current; and
   a level-shifter between the control output of said driving-control unit and a control input of said output driving unit, and configured to determine a level shift of a voltage of the first control signal for supplying to said control input of said output driving unit a second control signal having a voltage value that is increased with respect to, and is based upon the first control signal.

2. The driving stage according to claim 1, wherein said output driving unit comprises a plurality of output transistors having a respective control terminal receiving the second control signal, and a respective conduction terminal supplying the output driving current on a respective driving output of said output driving unit.

3. The driving stage according to claim 1, wherein said driving-control unit includes a logic-supply input configured to receive a logic supply voltage, and the first control signal has a maximum value not higher than the logic supply voltage; and wherein said level-shifter comprises a capacitor configured to store a shift voltage having a value such that the second control signal has a value higher than the logic supply voltage.

4. The driving stage according to claim 3, further comprising a charge pump stage; and wherein said output driving unit includes a boosted-supply input configured to receive a boosted voltage from said charge-pump stage, having a value higher than that of the logic supply voltage.

5. The driving stage according to claim 3, wherein said driving-control unit and said output driving unit comprise transistors operating in a voltage range not higher than the value of the logic supply voltage.

6. The driving stage according to claim 1, further comprising a feedback unit coupled to the control input of said output driving unit, and configured to supply to a feedback input of said driving-control unit a feedback current, a value of which is based upon the value of the output driving current.

7. The driving stage according to claim 6, wherein said driving-control unit is configured to generate said first control signal as a function of the value of the feedback current and of the input current.

8. The driving stage according to claim 7, wherein said driving-control unit defines a transresistance differential current amplifier, configured to receive on a first differential input and a second differential input the input current and the feedback current, and to generate at output the first control signal having a value such as to obtain, in a condition of equilibrium, a pre-set ratio between the feedback current and the input current.

9. The driving stage according to claim 6, wherein said output driving unit comprises a plurality of output branches configured to supply the output driving current on a respective output of said output driving unit, and wherein said feedback unit comprises a circuit branch mirrored with respect to said output branches, with a mirroring factor such that the value of the feedback current corresponds to a desired fraction of the value of the output driving current.

10. The driving stage according to claim 1, further comprising a refresh unit, coupled to said level-shifter and configured to receive an enable signal and to activate, as a function of a value of the enable signal, a refresh operation to a desired value of a shift voltage present across said level-shifter.

11. The driving stage according to claim 10, wherein a first value of the enable signal determines a first operating condition in which the refresh operation is carried out; and wherein a second value of the enable signal determines a second operating condition in which the output driving current based upon the input current is supplied.

12. The driving stage according to claim 11, wherein the enable signal is an impulse-type signal, and said refresh unit is configured to activate the refresh operation after the programming operation carried out on said at least one memory cell.

13. The driving stage according to claim 12, wherein said refresh unit comprises a selective current-conduction element, which is controlled by the enable signal and is operable for defining a conductive path between said level-shifter and a boosted-supply input configured to receive a boosted voltage during the refresh operation, and wherein said driving-control unit is configured to supply the first control signal to said level-shifter with a pre-set and controlled voltage value during the refresh operation.

14. A phase change non-volatile memory device comprising:
   an array of memory cells; and
   a driving stage operatively coupled to said array of memory cells, and comprising
      an output driving unit configured to supply an output driving current during a programming operation of at least one memory cell,
      a driving-control unit configured to receive an input current and to generate on a control output a first control signal configured to control supply of the output driving current by said output driving unit in such a way that a value of the output driving current is based upon the input current, and a level-shifter between the control output of said driving-control unit and a control input of said output driving unit, and configured to determine a level shift of a voltage of the first control signal for supplying to said control input of said output driving unit a second control signal having a voltage value that is increased with respect to, and is based upon the first control signal.

15. The phase change non-volatile memory device according to claim 14, wherein said output driving unit comprises a plurality of output transistors having a respective control terminal receiving the second control signal, and a respective conduction terminal supplying the output driving current on a respective driving output of said output driving unit.

16. The phase change non-volatile memory device according to claim 14, wherein said driving-control unit includes a logic-supply input configured to receive a logic supply voltage, and the first control signal has a maximum value not higher than the logic supply voltage; and wherein said level-shifter comprises a capacitor configured to store a shift voltage having a value such that the second control signal has a value higher than the logic supply voltage.

17. The phase change non-volatile memory device according to claim 16, wherein said driving stage further comprises a charge pump stage; and wherein said output driving unit includes a boosted-supply input configured to receive a boosted voltage from said charge-pump stage, having a value higher than that of the logic supply voltage.

18. The phase change non-volatile memory device according to claim 14, wherein said driving stage further comprises a feedback unit coupled to the control input of said output driving unit, and configured to supply to a feedback input of said driving-control unit a feedback current, a value of which is based upon the value of the output driving current.

19. The phase change non-volatile memory device according to claim 18, wherein said output driving unit comprises a plurality of output branches configured to supply the output driving current on a respective output of said output driving unit, and wherein said feedback unit comprises a circuit branch mirrored with respect to said output branches, with a mirroring factor such that the value of the feedback current corresponds to a desired fraction of the value of the output driving current.

20. The phase change non-volatile memory device according to claim 14, further comprising a column decoder configured to select bitlines of said array as a function of address signals during the programming operation, and is coupled between said driving stage and said array so as to receive said output driving current and supply it to the selected bitlines.

21. A method of driving a phase change non-volatile memory device, the method comprising:
supplying an output driving current, with an output driving unit, during an operation of programming of at least one memory cell of the phase change non-volatile memory device;
receiving an input current at a driving-control unit to generate on a control output a first control signal configured to control supply of the output driving current by the output driving unit in such a way that a value of the output driving current is based upon the input current; and
using a level-shifter between the control output of the driving-control unit and a control input of the output driving unit to determine a level shift of a voltage of the first control signal for supplying to said control input of said output driving unit a second control signal having a voltage value that is increased with respect to, and is based upon the first control signal.

22. The method according to claim 21, wherein the driving-control unit includes a logic-supply input configured to receive a logic supply voltage, and the first control signal has a maximum value not higher than the logic supply voltage; and wherein the level-shifter comprises a capacitor configured to store a shift voltage having a value such that the second control signal has a value higher than the logic supply voltage.

23. The method according to claim 22, wherein the output driving unit includes a boosted-supply input configured to receive a boosted voltage from a charge-pump stage, having a value higher than that of the logic supply voltage.

24. The method according to claim 21, further comprising coupling a feedback unit to the control input of the output driving unit, and configured to supply to a feedback input of the driving-control unit a feedback current, a value of which is based upon the value of the output driving current.

25. The method according to claim 24, wherein the output driving unit comprises a plurality of output branches configured to supply the output driving current on a respective output of the output driving unit, and wherein the feedback unit comprises a circuit branch mirrored with respect to the output branches, with a mirroring factor such that the value of the feedback current corresponds to a desired fraction of the value of the output driving current.

* * * * *